United States Patent
Arakawa et al.

(10) Patent No.: US 7,544,343 B2
(45) Date of Patent: Jun. 9, 2009

(54) CDTE SYSTEM COMPOUND SEMICONDUCTOR SINGLE CRYSTAL

(75) Inventors: Atsutoshi Arakawa, Kitaibaraki (JP); Ryuichi Hirano, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 204 days.

(21) Appl. No.: 11/667,676

(22) PCT Filed: Nov. 16, 2005

(86) PCT No.: PCT/JP2005/021010

§ 371 (c)(1), (2), (4) Date: May 14, 2007

(87) PCT Pub. No.: WO2006/054580

PCT Pub. Date: May 26, 2006

(65) Prior Publication Data

US 2008/0102022 A1    May 1, 2008

(30) Foreign Application Priority Data

Nov. 18, 2004  (JP)  .............................. 2004-334352

(51) Int. Cl.
- *C01B 19/04* (2006.01)
- *C30B 29/48* (2006.01)
- *H01L 29/12* (2006.01)

(52) U.S. Cl. ................ 423/508; 423/509; 252/62.3 ZT; 977/824; 117/956

(58) Field of Classification Search .................. 423/508, 423/509; 252/62.3 ZT; 977/824; 117/956
See application file for complete search history.

(56) References Cited

U.S. PATENT DOCUMENTS

| | | | | | |
|---|---|---|---|---|---|
| 4,105,472 | A | * | 8/1978 | Lancaster | ..................... 117/54 |
| 4,465,527 | A | * | 8/1984 | Nishizawa | .................... 117/79 |
| 4,619,718 | A | * | 10/1986 | Nishizawa | .................. 438/501 |
| 5,204,283 | A | * | 4/1993 | Kitagawa et al. | ............ 438/509 |
| 6,043,141 | A | * | 3/2000 | Wu et al. | ..................... 438/508 |
| 7,211,142 | B2 | * | 5/2007 | Hirano | ......................... 117/81 |

FOREIGN PATENT DOCUMENTS

| JP | 3-5399 A | 1/1991 |
|---|---|---|
| JP | 5-070298 A | 3/1993 |
| JP | 11-228299 A | 8/1999 |

OTHER PUBLICATIONS

M. Gauneau et al., Optical Materials, vol. 7, pp. 21 to 31, 3.3. Jan. 1997.

* cited by examiner

*Primary Examiner*—Timothy C Vanoy
(74) *Attorney, Agent, or Firm*—Birch, Stewart, Kolasch & Birch, LLP

(57) ABSTRACT

It is to define the resistivity and the contained amount of impurities of a CdTe system compound semiconductor single crystal and to provide a CdTe system compound semiconductor single crystal which is useful as a substrate for optical devices such as an infrared sensor and the like. In a CdTe system compound semiconductor single crystal for an optical device, a Group 1 (1A) element is included in a range of $5 \times 10^{14}$ to $6 \times 10^{15}$ cm$^{-3}$ in the crystal, a total amount of a Group 13 (3B) element and a Group 17 (7B) element included in the crystal is less than $2 \times 10^{15}$ cm$^{-3}$ and less than a total amount of the Group 1 (1A) element, and resistivity of the crystal is in a range of 10 to 104 Ωcm.

2 Claims, 2 Drawing Sheets

CDTE SYSTEM COMPOUND SEMICONDUCTOR SINGLE CRYSTAL

TECHNICAL FIELD

The present invention relates to a Group II-VI compound semiconductor single crystal, and more particularly, to a CdTe system compound semiconductor single crystal which is useful as a substrate for optical devices such as an infrared sensor and the like.

BACKGROUND ART

In general, a CdTe system compound semiconductor single crystal has the property of being high resistivity when Group 13 (3B) elements such as Al(aluminum), Ga(gallium), and In(indium), Group 17 (7B) elements such as F(fluorine), Cl(chlorine), Br(bromine), and I(iodine), Group 14 (4B) elements such as Ge(germanium) and Sn(tin), or transition metal element such as V(vanadium) is included in a small amount. Further, a CdTe system compound semiconductor single crystal has the property of exhibiting n-type conductivity when the CdTe system compound semiconductor single crystal is doped with sufficient amount of Group 13 (3B) elements or Group 17 (7B) elements. A high resistance CdTe system compound semiconductor single crystal which is obtained in such way is used as a substrate for a photorefractive element, an electro-optic element (EO element), and a radiography sensing element. In case where the CdTe system compound semiconductor single crystal is used for the above described purpose, it is known that the higher the resistivity of the CdTe system compound semiconductor single crystal substrate is, the more device properties enhance, and the resistivity is preferred to be more or equal to $1\times10^8$ $\Omega$cm.

For example, in Patent Document 1, a CdTe single crystal in which the concentration of Ga as a dopant is set to be in the range of $5\times10^{16}$ to $5\times10^{18}$ cm$^{-3}$ and the concentration of other impurity atoms is set to be below or equal to $7\times10^{14}$ cm$^{-3}$ in order to obtain a high resistance photorefractive crystal is disclosed. Here, Ga is used as a dopant because when In or V is used as a dopant, high concentration doping is needed in order to realize high resistivity and the crystalline is poor. According to the above described technique, high resistivity of more or equal to $1\times10^8$ $\Omega$cm can be realized in a CdTe single crystal.

Further, for example, in Patent Document 2, a CdTe single crystal in which the concentration of Cl in a crystal is in the range of 0.1 to 5. 0 ppmwt and the resistivity at room temperature is $1.0\times10^9$ $\Omega$cm is disclosed.

Meanwhile, a CdTe system compound semiconductor single crystal is widely used as a substrate for an infrared sensor for an approximate 2 to 20 μm band. In particular, a p-n junction diode in which p-type and n-type HgCdTe epitaxial layers are formed on a CdZnTe substrate is used. Concerning this CdZnTe substrate for an optical device, high quality p-type and n-type HgCdTe epitaxial layers on the substrate are important, and the substrate which does not have an adverse influence on the epitaxial layers is more important than the electrical properties of the substrate. However, there is a concern that impurities in the substrate diffuse to the epitaxial layers and have an adverse effect on the p-n characteristics. Therefore, the technique of doping with a small amount of impurities in order to obtain a high resistance substrate for a radiation detector and the like as described above is not preferred.

Patent Document 1 : Toku-kai-hei 5-70298
Patent Document 2: Toku-kai-hei 11-228299

DISCLOSURE OF THE INVENTION

Problems to be Solved by the Invention

As described above, concerning a CdTe system compound semiconductor single crystal for a photorefractive element, an electro-optic element (EO element), and a radiation detecting element, techniques for realizing the needed electric properties and the single crystal thereof are actively suggested. On the other hand, techniques for a CdTe system compound semiconductor single crystal for an optical device have not been examined adequately. This is because concerning a CdZnTe substrate for an optical device, it has been only discussed that the high quality p-type and n-type HgCdTe epitaxial layers on a CdZnTe substrate are important and the possibility of adversely effecting the p-n characteristics by diffusing impurities included in the CdZnTe substrate to the epitaxial layer is lower when the amount of impurities is small.

However, as in the example of an optical device in which GaAs or InP which is Group III-V compound semiconductor single crystal is used, in general, the substrate which has low resistivity is more useful for an optical device in respect of ohmic characteristics to the electrode. In the future, it is thought that it is important in terms of increasing the productivity of the device.

A CdTe system compound semiconductor single crystal has the property of easily being low resistivity when Group 1 (1A) elements such as Li and Na are included in the crystal. However, conventionally, when the CdTe system compound semiconductor single crystal is manufactured, impurities such as Group 1 (1A) elements and Group 13 (3B) elements are mixed without being controlled depending on the purity of raw material. Thereby, even when Group 1 (1A) elements are added to make the crystal have low resistivity, the amount of additive needed to be adjusted for every crystal of raw material in order to obtain the desired resistivity. It is considered that low resistivity is exhibited as a result of the effects of Group 1 (1A) elements and Group 13 (13A) elements counterbalancing each other. In such case, there is a possibility that Group 1 (1A) elements and Group 13 (13A) elements are included in high concentration.

That is, a large amount of impurities are included in the crystal even when the resistivity of the CdTe system compound semiconductor single crystal is within the predetermined range. Thus, there is a problem in which the device properties are degraded. Therefore, as a substrate for an optical device, it is important to give due consideration to the amount of impurities which does not have an adverse effect on the epitaxial layers and it is important that the CdTe system compound semiconductor single crystal has low resistivity.

An object of the present invention is to define the resistivity and the contained amount of impurities of a CdTe system compound semiconductor single crystal and to provide a CdTe system compound semiconductor single crystal which is useful as a substrate for optical devices such as an infrared sensor and the like.

Means for Solving the Problem

The present invention is made to solve the above described problem and a CdTe system compound semiconductor single crystal for an optical device in which a Group 1 (1A) element is included in a range of $5\times10^{14}$ to $6\times10^{15}$ cm$^{-3}$ in the crystal, a total amount of a Group 13 (3B) element and a Group 17 (7B) element included in the crystal is less than $2\times10^{15}$ cm$^{-3}$ and less than a total amount of the Group 1 (1A) element, and resistivity of the crystal is in a range of 10 to $10^4$ Ωcm. That is, in order to use a CdTe system compound semiconductor single crystal as a substrate for an optical device, good device properties cannot be ensured by merely setting the resistivity within a predetermined range. Therefore, the amount of impurities included in a crystal substrate is defined.

In such case, when the total amount of Group 13 (3B) element and Group 17 (17B) element is smaller than the concentration of Group 1 (1A) element, the effect of making a CdTe system compound semiconductor single crystal have high resistivity is low. Therefore, a CdTe system compound semiconductor single crystal having low resistivity can be realized. A CdTe system compound semiconductor means a compound semiconductor having Cd or Te as the main component in which a portion of Cd and Te or all of Cd or Te are replaced. For example, they are CdTe, CdZnTe, CdHgTe, or the like. Group 1 (1A) element means a group of H, Li, Na, K, Rb, and Cs. In the present invention, the amount of impurities of Li, Na, and K which are known to have the property of easily having low resistivity are intended. On the other hand, as Group 13 (13A) elements, Al, Ga, and In which are known to have the property of having high resistivity are intended, and as Group 17 (17A) elements, F, Cl, Br, and I are intended.

Further, Ge and Sn which are Group 14 (4B) elements and Ti, V, Cr, Mn, Fe, Co, and Ni which are transition metal elements are included in the crystal, the total amount of Group 13 (3B) elements, Group 17 (7B) elements, Ge and Sn which are Group 14 (4B) elements, and Ti, V, Cr, Mn, Fe, Co, and Ni which are transition metal elements included in the crystal is less than $2\times10^{15}$ cm$^{-3}$ and less than the total amount of Group 1 (1A) element. Similarly to Group 13 (3B) elements, because these elements have the property of making a CdTe system compound semiconductor single crystal have high resistivity, these elements preferably have lower concentration comparing to the concentration of Group 1 (1A) elements.

In the present invention, the concentration of impurities included in CdTe system compound semiconductor single crystal is defined. This is because, depending on the purity level of raw material at the manufacturing of a CdTe system compound semiconductor single crystal, it is difficult to remove the impurities (here, Group 13 (3B) element and the like) which are not preferable for lowering the resistivity so as to be not more than the detection limit. Therefore, in order to obtain good electric properties, it is needless to say that the concentration of impurities is preferred to be as low as possible.

A background in which the present invention was achieved will be described bellow.

In general, a CdTe system compound semiconductor single crystal exhibits p-type conductivity of low resistivity when a small amount of Group 1 (1A) elements such as Li or Na is included, and the resistivity lowers when the doping amount of Group 1 (1A) elements is increased and the resistivity raises when the doping amount is decreased. The present inventors and others examined the relationship between the resistivity of a CdTe system compound semiconductor single crystal and the device properties.

Particularly, by using a CdZnTe single crystal substrate which is one of the CdTe system compound semiconductor single crystals, an epitaxial crystal of a simple optical device construction was made by forming a HgCdTe buffer layer which was undoped and which exhibited p-type electrical conductivity on the substrate and an In-doped n-type HgCdTe active layer was further formed thereon. By using electrodes formed on the surface of the epitaxial crystal, the mobility and the current-voltage properties (I-V properties) were measured and the I-V properties between the electrode formed on a backside of the substrate and the electrode on the surface of the epitaxial crystal were evaluated. In the experiment, the concentration of impurities other than Group 1 (1A)in the CdZnTe single crystal was reduced as much as possible. That is, total amount of Al, Ga, and In among Group 13 (3B) elements, F, Cl, Br, and I among Group 17 (7B) elements, Ge and Sn among Group 14 (4B) elements, and Ti, V, Cr, Mn, Fe, Co, and Ni among transition metal elements which are the impurities which control the CdZnTe single crystal so as to have high resistivity was lower than $5\times10^{14}$ cm$^{-3}$.

As a result, it was found that good electric properties could be obtained when the resistivity of a CdZnTe single crystal was in the range of 10 to $10^4$ Ωcm. When the concentration of Group 1 (1A) elements was $6\times10^{15}$ cm$^{-3}$, the resistivity was 10 Ωcm, and the resistivity was $10^4$ Ωcm when the concentration was $5\times10^{14}$ cm$^{-3}$.

That is, when the resistivity was lower than 10 Ωcm, the substantial amount of Group 1 (1A) elements were doped. Therefore, it was considered that the purity level of a CdTe system compound semiconductor single crystal was degraded. As a result, the electric properties were degraded. On the other hand, when the resistivity of the crystal was greater than $10^4$ Ωcm, the contact resistance between the electrode and the CdTe system compound semiconductor single crystal substrate when the electrode was formed was high and the ohmic characteristics was degraded. Thus, it was considered that the electric properties became poor.

Accordingly, in order to realize a CdTe system compound semiconductor single crystal having low resistivity, it was found that the concentration of Group 1 (1A) elements in a single crystal needed to be in the range of $5\times10^{14}$ to $6\times10^{15}$ cm$^{-3}$.

Next, a relationship between the amount of impurities included in a CdZnTe single crystal which was made to have p-type low resistivity by being doped with Group 1 (1A) elements and the device properties was examined. This is because, depending on the purity level of raw material at the manufacturing of a CdZnTe single crystal, there is some possibility that impurity elements other than Group 1 (1A) elements are mixed in, and these impurity elements effect the resistivity of a CdZnTe single crystal and optical device properties using the CdZnTe single crystal substrate. In particular, when CdZnTe single crystal having p-type low resistivity was grown, Group 1 (1A) elements and other impurity elements (for example, Ga which is Group 13 (3B) elements and Cl which is Group 17 (7B) elements) were deliberately mixed in, and a relationship between the contained amount of impurities (concentration) in the obtained CdZnTe single crystal and the device properties was examined.

As a result, when the total amount of Group 13 (3B)+ Group 17 (7B) elements was more than the total amount of Group 1 (1A) elements, the resistivity of a CdZnTe single crystal was larger than $10^4$ Ωcm. Thus, it was found that the device properties are degraded. That is, it is considered that the CdZnTe single crystal easily has high resistivity because the resistivity is controlled by Group 13 (3B)+Group 17 (7B) elements rather than Group 1 (1A) elements.

When the total amount of Group 13 (3B)+Group 17 (7B) elements was less than the total amount of Group 1 (1A) elements but is not less than $2\times10^{15}$ cm$^{-3}$, it was found that the device properties of a CdZnTe single crystal are degraded. The cause of degradation was considered as the diffusion of Group 13 (3B)+Group 17 (7B) elements to the epitaxial layer. In this case, the resistivity of the crystal meets the range of 10 to $10^4$ Ωcm.

Contrary to this, when the total amount of Group 13 (3B)+ Group 17 (7B) elements was less than the total amount of Group 1 (1A) elements and less than $2 \times 10^{15}$ cm$^{-3}$, it was found that the device properties of a CdZnTe single crystal is controlled by the total amount of Group 1 (1A) elements included in the crystal. The above described examination results are summarized and shown in Table 1.

TABLE 1

| | | | Total amount of Group 1 (1A) elements (cm$^{-3}$) | | |
|---|---|---|---|---|---|
| | | | <5 × 10$^{14}$ | 5 × 10$^{14}$~6 × 10$^{15}$ | >6 × 10$^{15}$ |
| Total amount of Group 13 (3B) + Group 17 (7B) elements | <Total amount of Group 1 (1A) elements | <2 × 10$^{15}$ cm$^{-3}$ | X | ○ | X |
| | | ≧2 × 10$^{15}$ cm$^{-3}$ | X (device properties are degraded) | | |
| | >Total amount of Group 1 (1A) elements | | X (resistivity > 10$^4$ Ωcm) | | |

Moreover, not only Group 13 (3B) elements and Group 17 (7B) elements but also Sn and Ge among Group 14 (4B) elements and Ti, V, Cr, Mn, Fe, Co, and Ni among transition metal elements have the property of making a CdTe system compound semiconductor single crystal have high resistivity. An experiment similar to the case of Group 13 (3B)+Group 17 (7B) elements as described above was carried out. The results as shown in Table 2 were obtained, and it was confirmed that there is a tendency similar to Table 1 between the total amount of Group 1 (1A) elements and the total amount of the impurity elements. Accordingly, it was found that the device property was degraded when the total amount of impurities other than Group 1 (1A) elements (such as Group 13 (3B) elements, Group 17 (7B) elements, Ge and Sn among Group 14 (4B) elements, and Ti, V, Cr, Mn, Fe, Co, and Ni among transition metal elements) included in a CdTe system compound semiconductor single crystal is not less than $2 \times 10^{15}$ cm$^{-3}$.

TABLE 2

| | | Total amount of Group 1 (1A) elements(cm$^{-3}$) | | |
|---|---|---|---|---|
| | | <5 × 10$^{14}$ | 5 × 10$^{14}$~6 × 10$^{15}$ | >6 × 10$^{15}$ |
| The total amount of Ge, Sn, Ti~Ni | <Total amount of Group 1 (1A) elements | X | ○ | X |
| | >Total amount of Group 1 (1A) elements | X (resistivity > 10,000 Ωcm) | | |

From the above description, by setting the total amount Group 1 (1A) elements in the crystal to the range of $5 \times 10^{14}$ to $6 \times 10^{15}$, and by setting the total amount of Group 13 (3B)+ Group 17 (7B) elements to less than the total amount of Group 1 (1A) elements, setting the total amount of Ge and Sn among Group 14 (4B) elements and Ti, V, Cr, Mn, Fe, Co, and Ni among transition metal elements to less than the total amount of Group 1 (1A) elements, and setting the total amount of above described impurities other than Group 1 (1A) elements to less than $2 \times 10^{15}$ cm$^{-3}$, it was found that a p-type CdTe system compound semiconductor single crystal with low resistivity (10 to 10$^4$ Ωcm) and good electric properties can be realized, and the present invention was completed. That is, even when the above mentioned impurities other than Group 1 (1A) elements is mixed in an amount which exceeds the detection limit, it means that there is no effect to the device properties of an optical device made by a CdTe system compound semiconductor single crystal as long as the total amount of impurities is less than $2 \times 10^{15}$ cm$^{-3}$ and less than Group 1 (1A) elements.

In claims of the present application, a CdTe system compound semiconductor single crystal for an optical device is claimed. However, a CdTe system compound semiconductor single crystal can be similarly applied to not only a substrate, but also a p-n junction diode in which a CdTe system compound semiconductor epitaxial single crystal is grown on a different type substrate such as Si and p-type and n-type HgCdTe are formed thereon.

Effect of the Invention

According to the present invention, in a CdTe system compound semiconductor single crystal for an optical device which is doped with Group 1 (1A) elements, the degradation of the purity level of the crystal due to a dopant and other impurities is suppressed by setting the total amount of Group 1 (1A) elements included in the crystal to the range of $5 \times 10^{14}$ to $6 \times 10^{15}$ cm$^{-3}$, and by setting the total amount of Group 13 (3B) elements and Group 17 (7B) elements to less than $2 \times 10^{15}$ cm$^{-3}$ and less than the total amount of Group 1 (1A) elements. Thus, low resistivity (in the range of 10 to 10$^4$ Ωcm) can be realized while avoiding the degradation of electrical property associated with the degradation of the purity level of the crystal.

Consequently, by using a CdTe system compound semiconductor single crystal as a substrate for optical devices such as an infrared sensor and the like, an optical device which is made by an epitaxial crystal having excellent electric properties (mobility, I-V degradation property, and the like) can be provided.

EXPLANATION OF REFERENCE NUMERALS

101 CdZnTe single crystal substrate
102 HgCdTe buffer layer
103 In-doped HgCdTe active layer
104 In electrode
105 Au electrode Best Mode for Carrying Out the Invention Hereinafter, preferred embodiments of the present invention will be described with reference to drawings.

Figure 1:
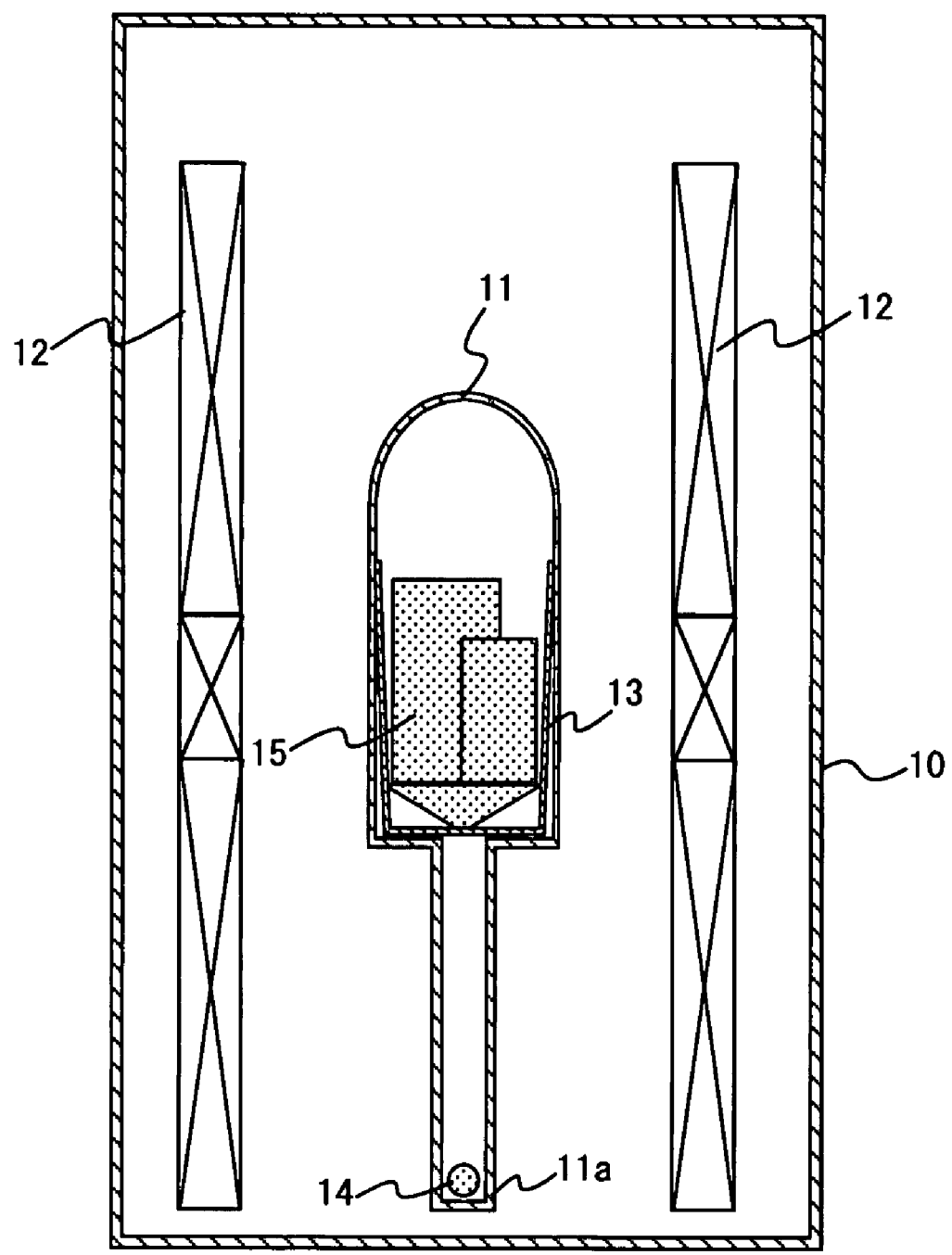
[FIG. 1] This is a view showing a schematic structure of a crystal growing apparatus in which a VGF method is used.

FIG. 1 is a view showing a schematic structure of a crystal growing apparatus according to the embodiment in which a CdZnTe single crystal is grown by a VGF method.

In FIG. 1, the reference numeral 10 is a high-pressure container. A quartz ampoule 11 having a reservoir unit 11a is placed at the center of the high-pressure container 10. Further, a pBN crucible 13 is placed in the quartz ampoule 11, and heaters 12 are provided so as to enclose the quartz ampoule 11. The construction of the heaters 12 is not particularly limited. However, the heaters 12 are preferred to be constructed so that a portion which corresponds to the crucible 13 and a portion which corresponds to the reservoir unit 11a may be heated to different temperatures and also, for example, the heaters 12 are preferred to be in a multi-stage construction having three stages so that the temperature distribution in the high-pressure container 10 can be controlled precisely.

CdTe and ZnTe polycrystals which were synthesized from raw material in which Cd, Zn, and Te are highly purified by distillation or zone refining in advance were used as CdZnTe single crystal growth material. Impurity level can vary according to the method required for purification of raw material and the number of steps (cost).

EXAMPLE 1

First, 15 g of Cd simple substance 14 which is an readily-volatile element was set in the reservoir unit 11a of the quartz ampoule 11 and 3,850 g of CdZnTe raw material 15 was set in the pBN crucible 13 and the pBN crucible 13 was placed in the quartz ampoule 11. Then, the quartz ampoule 11 was sealed. Here, block-divided CdTe polycrystal including a predetermined amount of Li which is Group 1 (1A) element and manufactured by following the manufacturing method of CdTe polycrystal disclosed in, for example, JP2003-277197A and granulated ZnTe block were used as CdZnTe raw material 15.

The heaters 12 heated and raised temperature to fuse the CdZnTe raw material 15 in the crucible 13. The heaters 12 heated the reservoir unit 11a to a predetermined temperature, for example, in the range of 770° C. to 830° C. to control the vapor pressure, and the heaters 12 heated the crucible 13.

Further, the temperature in a heating furnace was gradually decreased to grow a CdZnTe single crystal while power supply to each heater was controlled by a controlling device (omitted from the drawing) so that the desired temperature distribution occurs in the high-pressure container 10. By growing a CdZnTe single crystal at the growth rate of 0.24 mm/hr for 300 hours, a CdZnTe single crystal ingot of 110 mm in diameter and 70 mm in length was obtained.

The obtained CdZnTe single crystal was cut out as a CdZnTe single crystal substrate 101. Concerning the substrate, the concentration of the contained impurity elements was measured by a GDMS (Glow Discharge Mass Spectrometer). The concentration of Group 1 (1A) elements including Li was $4.2 \times 10^{15}$ cm$^{-3}$ and was in the range of $5 \times 10^{14}$ to $6 \times 10^{15}$ cm$^{-3}$. Total amount of Group 13 (3B) elements which were Ga, In, and Al and Group 17 (7B) elements such as Cl and the like was $1.9 \times 10^{15}$ cm$^{-3}$ and was lower than the concentration of Group 1 (1A) elements.

Figure 2:
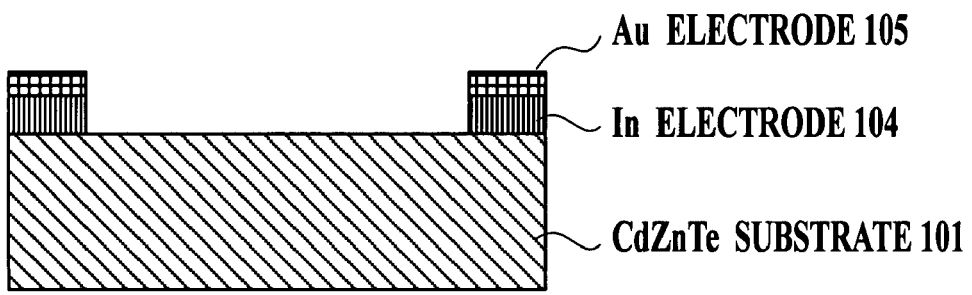
[FIG. 2] This is a sectional view showing a structure of a CdZnTe single crystal substrate.

Further, mirror etching was carried out on the CdZnTe single crystal substrate 101 with bromine-methanol solution, and In-electrodes 104 and Au-electrodes 105 were orderly formed on the substrate (see FIG. 2). As a result of measuring the resistivity by a pan der Pauw method, the resistivity of the CdZnTe single crystal substrate was $5.0 \times 10^{1}$ Ωcm and was in a range of 10 to $10^4$ Ωcm.

Figure 3:
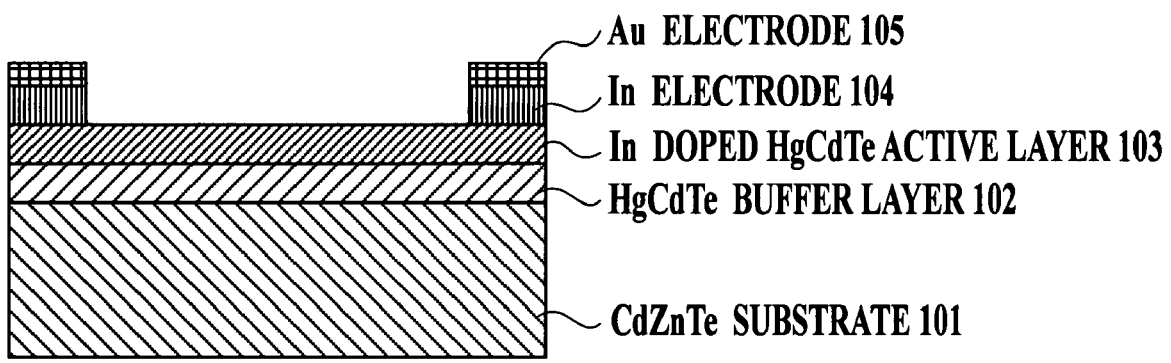
[FIG. 3] This is a sectional view showing an epitaxial crystal in which an HgCdTe epitaxial layer is grown on a CdZnTe single crystal substrate.

After carrying out the mirror etching on the CdZnTe single crystal substrate 101 with bromine-methanol solution, an HgCdTe buffer layer 102 of 0.05 μm and an In-doped n-type HgCdTe active layer 103 of 0.95 μm were orderly grown on the substrate by a MBE method and an epitaxial crystal was made. Subsequently, In-electrodes 104 and Au-electrodes 105 are orderly formed on the layer after annealing (see FIG. 3), and mobility was measured by the pan der Pauw method. Further, I-V characteristics were also measured when voltage was applied (current μA level). As a result, the mobility of the epitaxial crystal at the liquid nitrogen temperature was 125,000 cm$^2$/V·s, and it was not found that I-V characteristic was degraded after applying voltage for 150 hours at a room temperature. I-V characteristic between the electrode formed on a back side of the substrate and the electrode on a surface on the epitaxial crystal was evaluated and it was confirmed that it was ohmic.

EXAMPLE 2

As CdZnTe raw material, block-divided CdTe polycrystal including smaller amount of Li comparing to example 1 and granulated ZnTe block were used. In the same method as in example 1, a CdZnTe single crystal ingot of 110 mm in diameter and 70 mm in length was obtained.

The obtained CdZnTe single crystal was cut out as a CdZnTe single crystal substrate 101. Concerning the substrate, the concentration of the contained impurity elements was measured by a GDMS (Glow Discharge Mass Spectrometer). The concentration of Group 1 (1A) elements including Li was $5.8 \times 10^{14}$ cm$^{-3}$ and was in the range of $5 \times 10^{14}$ to $6 \times 10^{15}$ cm$^{-3}$. Total amount of Group 13 (3B) elements which are Ga, In, and Al and Group 17 (7B) elements such as Cl and the like was $4.6 \times 10^{14}$ cm$^{-3}$ and was lower than the concentration of Group 1 (1A) elements.

Further, mirror etching was carried out on the CdZnTe single crystal substrate 101 with bromine-methanol solution, and In-electrodes 104 and Au-electrodes 105 were orderly formed on the substrate (see FIG. 2). As a result of measuring the resistivity by a pan der Pauw method, the resistivity of the CdZnTe single crystal substrate was $7.6 \times 10^{3}$ Ωcm and was in a range of 10 to $10^4$ Ωcm.

After carrying out the mirror etching on the CdZnTe single crystal substrate 101 with bromine-methanol solution, an HgCdTe buffer layer 102 of 0.05 μm and an In-doped n-type HgCdTe active layer 103 of 0.95 μm were orderly grown on the substrate by a MBE method, and an epitaxial crystal was made. Subsequently, In-electrodes 104 and Au-electrodes 105 were orderly formed on the layer after annealing (see FIG. 3), and the mobility was measured by the pan der Pauw method. Further, I-V characteristics were also measured when voltage was applied (current μA level). As a result, the mobility of the epitaxial crystal at the liquid nitrogen temperature was 127,000 cm²/V·s, and it was not found that I-V characteristic was degraded after applying voltage for 150 hours at a room temperature. I-V characteristic between the electrodes formed on a back side of the substrate and the electrodes on a surface on the epitaxial crystal was evaluated and it was confirmed that it was ohmic.

COMPARATIVE EXAMPLE

By the same method, the concentration of Li included in a CdTe polycrystal which is CdZnTe raw material was varied and a CdZnTe single crystal was grown. The resistivity and the concentration of impurities in the obtained CdZnTe single crystal were measured. Further, electric properties of an epitaxial crystal obtained by growing an HgCdTe epitaxial layer on the CdZnTe single crystal substrate were measured.

Table 3 shows measurement results of the resistivity of the CdZnTe substrate, the concentration of Group 1 (1A) elements, and the concentration of Group 13 (3B)+Group 17 (7B) elements. Table 4 shows measurement results of the mobility and I-V characteristic of the epitaxial crystal.

TABLE 3

CdZnTe single crystal substrate

| | Resistivity (Ωcm) | Concentration of Group 1 (1A) elements (cm⁻³) | Concentration of Group 13 + Group 17 elements (cm⁻³) |
|---|---|---|---|
| Example 1 | $5.0 \times 10^1$ | $4.2 \times 10^{15}$ | $1.9 \times 10^{15}$ |
| Example 2 | $7.6 \times 10^3$ | $5.8 \times 10^{14}$ | $4.6 \times 10^{14}$ |
| Comparative example 1 | $4.5 \times 10^4$ | $8.7 \times 10^{14}$ | $3.2 \times 10^{15}$ |
| Comparative example 2 | $8.0 \times 10^5$ | $4.1 \times 10^{15}$ | $1.2 \times 10^{16}$ |
| Comparative example 3 | $1.5 \times 10^0$ | $8.5 \times 10^{15}$ | $1.8 \times 10^{15}$ |
| Comparative example 4 | $4.5 \times 10^1$ | $5.1 \times 10^{15}$ | $2.5 \times 10^{15}$ |

TABLE 4

Epitaxial crystal

| | Mobility (cm2/V · s) | I-V degradation property (%) |
|---|---|---|
| Example 1 | 125,000 | 100 |
| Example 2 | 127,000 | 100 |
| Comparative example 1 | 111,000 | 75 |
| Comparative example 2 | 109,000 | 55 |
| Comparative example 3 | 87,000 | — |
| Comparative example 4 | 112,000 | 70 |

In comparative example 1, the concentration of Group 1 (1A) elements in the CdZnTe single crystal substrate was $8.7 \times 10^{14}$ cm⁻³. The concentration of Group 13 (3B)+Group 17 (7B) elements was $3.2 \times 10^{15}$ cm⁻³ and was higher than the concentration of Group 1 (1A) elements, and was higher than $2.0 \times 10^{15}$ cm⁻³. Here, the resistivity of the CdZnTe single crystal substrate is greatly effected by Group 13 (3B)+Group 17 (7B) elements and the resistivity is $4.5 \times 10^4$ Ωcm which was higher than $10^4$ Ωcm and one digit greater than that of example 2. The mobility of the epitaxial crystal at the liquid nitrogen temperature was 111,000 cm²/V·s, and I-V characteristic which was measured after voltage was applied for 150 hours at a room temperature became 75% of the current value which was measured when voltage was initially applied. Therefore, it is found that crystalline is poor.

In comparative example 2, the concentration of Group 1 (1A) elements in the CdZnTe single crystal substrate was $4.1 \times 10^{15}$ cm⁻³ and was in the range of $5 \times 10^{14}$ to $6 \times 10^{15}$ cm⁻³. The concentration of Group 13 (3B) +Group 17 (7B) elements was $1.2 \times 10^{16}$ cm⁻³ and was higher than the concentration of Group 1 (1A) elements, and was higher than $2.0 \times 10^{15}$ cm⁻³. Here, the resistivity of the CdZnTe single crystal substrate was $8.0 \times 10^5$ Ωcm which was higher than $10^4$ Ωcm and one more digit higher than that of comparative example 1. It is considered that this is caused because Group 13 (3B)+Group 17 (7B) elements which allow a CdZnTe single crystal to have high resistivity have greater influence on the resistivity due to the greater concentration of Group 13 (3B)+Group 17 (7B) elements comparing to comparative example 1 and great difference with the concentration of Group 1 (1A) elements. Further, the mobility of the epitaxial crystal at the liquid nitrogen temperature was 109,000 cm²/V·s, and I-V characteristic which was measured after voltage was applied for 150 hours at a room temperature became 55% of the current value which was measured when voltage was initially applied. This shows that the I-V characteristic is degraded notably and the increase in total amount of impurities makes the crystalline be even poorer. From the above, it is found that as the resistivity of the CdZnTe single crystal substrate increases, the electric properties are degraded.

In comparative example 3, the concentration of Group 1 (1A) elements in the CdZnTe single crystal substrate was $8.5 \times 10^{15}$ cm⁻³ and was higher than $6 \times 10^{15}$ cm⁻³. The concentration of Group 13 (3B) +Group 17 (7B) elements was $1.8 \times 10^{15}$ cm⁻³ which was lower than the concentration of Group 1 (1A) elements, and was lower than $2.0 \times 10^{15}$ cm⁻³. Here, it was found that the resistivity of the CdZnTe single crystal substrate was 1.5 Ωcm and was lower than 10 Ωcm. The mobility of the epitaxial crystal at the liquid nitrogen temperature was 87,000 cm²/V·s, and I-V characteristic could not be measured after voltage is applied for 150 hours at a room temperature and electric properties were degraded comparing to the examples. From the above, it is considered that excessively large concentration of Group 1 (1A) elements makes the crystalline be poor and degrades the electric properties because the conductivity is impaired by the diffusion of Group 1 (1A) elements to the n-type epitaxial crystal.

In comparative example 4, the concentration of Group 1 (1A) elements in the CdZnTe single crystal substrate was $5.1 \times 10^{15}$ cm⁻³ and was in the range of $5 \times 10^{14}$ to $6 \times 10^{15}$ cm⁻³. The concentration of Group 13 (3B)+Group 17 (7B) elements was $2.5 \times 10^{15}$ cm⁻³ and was lower than the concentration of Group 1 (1A) elements, however, the value was higher than $2.0 \times 10^{15}$ cm⁻³. Here, the resistivity of the CdZnTe single crystal substrate was $4.5 \times 10^1$ Ωcm and was in the range of 10 to $10^4$ Ωcm. However, the mobility of the epitaxial crystal at the liquid nitrogen temperature was 112,000 cm²/V·s, and I-V characteristic which was measured after voltage was applied for 150 hours at a room temperature was 70% of the current value which was measured when voltage was initially applied. It was found that the I-V characteristic was degraded comparing to the examples. From the above, it is considered that excessively large concentration of Group 13 (3B)+Group 17 (7B) elements degrades the electric properties because the crystalline of the CdZnTe single crystal becomes poor.

As described above, in the embodiment, concerning a CdZnTe compound semiconductor single crystal for an optical device which is made to have p-type low resistivity by doping with Group 1 (1A) elements, the degradation of purity of the crystal by a dopant and other impurities can be suppressed and the resistivity can be in the range of 10 to $10^4$ Ωcm by making the total amount of Group 1 (1A) elements included in the crystal be in the range of $5\times10^{14}$ to $6\times10^{15}$ cm$^{-3}$, and the total amount of Group 13 (3B) +Group 17 (7B) elements included in the crystal be less than $2\times10^{15}$ cm$^{-3}$ and less than the total amount of the Group 1 (1A) elements. Accordingly, the degradation of the electric properties accompanying the degradation of purity of the crystal can be avoided. Therefore, an optical device made with an epitaxial crystal having excellent electric properties (mobility, I-V degradation property, and the like) can be provided by using the above described CdTe system compound semiconductor single crystal as a substrate for optical devices such as an infrared sensor and the like.

As described above, the present invention made by the inventors is concretely explained based on the embodiment. However, the present invention is not limited to the above described embodiments and can be modified within the scope of the invention. For example, explanations are given for the case where a CdZnTe single crystal is used as a substrate. However, the present invention can be applied to a case where other CdTe system compound semiconductor single crystal (for example, CdTe single crystal) is made to have low resistivity.

In the above described embodiments, descriptions are given for Group 1 (1A) elements and Group 13 (3B)+Group 17 (7B) elements included in a CdZnTe single crystal. However, there is a similar tendency in Ge and Sn among Group 14 (4B) elements and Ti, V, Cr, Mn, Fe, Co, and Ni among transition metal elements which have the property to control CdZnTe single crystal to have high resistivity. Therefore, the concentration of these impurity elements is preferred to be lower than concentration of Group 1 (1A) elements. Further, electric properties are degraded by the degradation of crystal purity when the concentration of impurities included in CdZnTe single crystal is high. Therefore, the concentration of impurities is preferred to be as low as possible.

The invention claimed is:

1. A CdTe system compound semiconductor single crystal for an optical device, wherein
   a Group 1 (1A) element is included in a range of $5\times10^{14}$ to $6\times10^{15}$ cm$^{-3}$ in the crystal,
   a total amount of a Group 13 (3B) element and a Group 17 (7B) element included in the crystal is less than $2\times10^{15}$ cm$^{-3}$ and less than a total amount of the Group 1 (1A) element, and
   resistivity of the crystal is in a range of 10 to $10^4$ Ωcm.

2. The CdTe system compound semiconductor single crystal as claimed in claim 1, wherein
   a Group 14 (4B) element and a transition metal element are further included in the crystal, and
   a total amount of the Group 13 (3B) element, the Group 17 (7B) element, Ge and Sn which are the Group 14 (4B) elements, and Ti, V, Cr, Mn, Fe, Co, and Ni which are the transition metal elements included in the crystal is less than $2\times10^{15}$ cm$^{-3}$ and less than the total amount of the Group 1 (1A) element.

* * * * *